United States Patent [19]

Sumi et al.

[11] Patent Number: 5,194,405
[45] Date of Patent: Mar. 16, 1993

[54] METHOD OF MANUFACTURING A SEMICONDUCTOR DEVICE HAVING A SILICIDE LAYER

[75] Inventors: Hirofumi Sumi; Toshiyuki Nishihara, both of Kanagawa, Japan

[73] Assignee: Sony Corporation, Tokyo, Japan

[21] Appl. No.: 830,555

[22] Filed: Feb. 3, 1992

Related U.S. Application Data

[63] Continuation of Ser. No. 549,142, Jul. 6, 1990, abandoned.

[30] Foreign Application Priority Data

Jul. 6, 1989 [JP] Japan .................................. 1-175105

[51] Int. Cl.$^5$ .......................................... H01L 21/283
[52] U.S. Cl. ........................................ 437/200; 437/238; 148/DIG. 19; 148/DIG. 118
[58] Field of Search ............... 437/200, 192, 195, 238; 148/DIG. 19, DIG. 147, DIG. 118; 357/67 S, 71 S

[56] References Cited

U.S. PATENT DOCUMENTS

| | | |
|---|---|---|
| 4,551,908 | 11/1985 | Nagasawa et al. |
| 4,557,036 | 12/1985 | Kyuragi et al. |
| 4,657,628 | 4/1987 | Holloway et al. ............... 437/23 S |
| 4,701,349 | 10/1987 | Koyanagi et al. ............... 437/228 |
| 4,784,973 | 11/1988 | Stevens et al. ............... 437/200 |
| 4,816,425 | 3/1989 | McPherson ............... 437/200 |

FOREIGN PATENT DOCUMENTS

| | | |
|---|---|---|
| 57424 | 6/1973 | Australia. |
| 63-84064 | 4/1988 | Japan. |

OTHER PUBLICATIONS

Li, B. et al., "Selective Titanium Silicide Formation ...", 1046B *Extended Abstracts*, Spring 1987, No. 1, p. 342.

Ma, J. et al., "Backscattering-Analysis of the Successive Layer ...", *Thin Solid Films*, vol. 64, No. 3, 1979, pp. 41-439-444.

*Primary Examiner*—T. N. Quach
*Attorney, Agent, or Firm*—Hill, Steadman & Simpson

[57] ABSTRACT

A method of manufacturing semiconductor devices wherein a silicon compound is formed on a silicon substrate, the silicon compound having a thickness less than 50Å. Next, a metal film is formed on the silicon compound film, then, a two step annealing process which includes a low temperature annealing followed by a high temperature annealing is performed. A metal silicide film may be formed with high selectivity on the silicon substrate by forming a silicide layer on the silicon compound.

4 Claims, 3 Drawing Sheets

METHOD OF MANUFACTURING A SEMICONDUCTOR DEVICE HAVING A SILICIDE LAYER

This is a continuation of application Ser. No. 549,142, filed Jul. 6, 1990, now abandoned.

BACKGROUND OF THE INVENTION

1. Technical Field

The present invention relates to a method of manufacturing semiconductor devices, and more particularly to a method of manufacturing semiconductor devices utilizing silicide technology.

2. Brief Description of the Prior Art

SALICIDE (self aligned silicide) technology is an art where in a metal silicide film is formed on a diffused layer and a gate electrode to decrease the sheet resistance thereof. A method of forming a silicide layer on a diffused layer is disclosed for example, in Japanese Patent Publication TOKKAI-SHO 63-84064. A prior art method of semiconductor manufacture utilizing SALICIDE technology will be described with reference to FIG. 1.

As shown in the drawing, a field insulating film 102, such as silicon oxide ($SiO_2$), is selectively formed on portions of a P-type silicon substrate 101, for isolation between various elements. Then, a gate insulating film 103, such as a thermally grown $SiO_2$ film is formed on the surface of an active region between the field insulating portions 102. Next, a polycrystalline silicon film 104 is formed on the surface of the gate insulating film by a CVD (chemical vapor deposition) process, after which inpurities such as phosphorous (P) are doped into the poly crystalline film to decrease the resistance thereof. The polycrystalline film is then etched in a desired pattern to form the gate electrode 104, atop the insulating film 103. Conventionally, N-type impurities, phosphorous for example, are then implanted at low concentration into the silicon substrate 101, with the gate electrode 104 acting as a mask, after which a further $SiO_2$ film 109 is deposited over the gate electrode 104 and the gate insulating film 103. This $SiO_2$ film is subjected to anisotropic etching vertically and horizontally relative to the substrate 101 by a reactive ion etching (RIE) process to form side wall spacers 105 on the sides of the gate electrode 104. Then, N-type impurities such as arsenic (As) are implanted at high concentration into the silicon substrate 101 with the side wall spacers 105 acting as a mask, with annealing being then performed to electrically activate the implanted impurities.

The above step forms the N+ type source region 106 and the drain region 107 which are self-aligned relative the gate electrode 104. A N-channel MOS FET is thus formed consisting of the gate electrode 104, the source region 106 and the drain region 107. In such a construction both the source and drain regions will form lightly doped N- regions 106a and 107a at positions under the side wall spacer 105. Hence the above described N-channel MOS FET has a so-called LDD (Lightly Doped Drain) structure wherein the lightly doped region 107a moderates the electric field near to drain region 107. After this a titanium film 108 is formed over the entire surface the above-mentioned elements via a sputtering process.

An annealing process is then performed at 600° C. in an atmosphere of argon (Ar) to react the Ti film 108 where it contacts the gate electrode 104, the source region 106 and the drain region 107. This process converts surface portions of the gate electrode 104, the source region 106 and the drain region 107 into a silicide layer. As shown in FIG. 1, titanium silicide (TiSi) films 109a, 109b and 109c are formed on the surfaces of the gate electrode 104, the source region 106 and the drain region 107, respectively. Finally, the unreacted Ti film is removed using a wet etching process.

In MOS LSIs manufactured according to the above method, the TiSi films 109a, 109b and 109c can decrease the sheet resistances of the gate electrode 104, the source region 106 and the drain region 107.

However, the conventional silicide forming technique described above has a disadvantage in that silicon atoms may 'ooze into' the side wall spacer 105 through the silicon substrate 101, so that an undesired TiSi film 109d, shown as a broken line in FIG. 1, is formed on the side wall spacer 105, which is not removable by post etching. This results in an electrical short circuit between the gate electrode 104 and the drain region 107, this phenomenon reduces production efficiency and is responsible for a high number of defective LSIs.

SUMMARY OF THE INVENTION

Therefore, it is the object of the present invention to overcome the deficiencies of the prior art.

It is a further object of the invention to provide a method of manufacturing a semiconductor device wherein a low resistance value metal silicide film may be selectively formed on a predetermined portion of a silicon substrate.

It is a further object of the invention to provide a method of manufacturing a semiconductor which has high reliability.

These and other objects, which will become clear hereinafter, may be accomplished by providing a method for manufacturing semiconductor devices comprising the steps of:

forming a film of a silicon compound on a silicon substrate, the silicon compound film having a thickness of 50Å or less;

forming a metal film on the silicon compound film;

annealing the substrate, the silicon film and the metal film at a temperature sufficiently high to form a silicide layer on the silicon substrate.

According to a further aspect of the present invention a method of manufacturing a semiconductor device may be provided comprising the steps of:

selectively forming a film of a silicon compound on areas of a silicon substrate;

forming a second film of the silicon compound over the selectively formed film and the silicon substrate the second film having a thickness of less than 50Å;

forming a metal film on the second film;

performing a first annealing on the substrate, the silicon film and the metal film;

performing a second annealing on the substrate, the silicon film and the metal film the second annealing being performed at a higher temperature than the first annealing for forming a silicide layer on the substrate;

According to a still further aspect of the present invention a semiconductor device may be provided comprising: a silicon substrate; a film of a silicon compound selectively formed on areas of the substrate; a silicide layer selectively formed between the selectively formed areas of the film, the silicide layer being formed of a silicon compound layer having a thickness of less than 50Å and a metal film layer by annealing and the silicide layer having a sheet resistance of substantially 4Ω/□.

BRIEF DESCRIPTION OF THE DRAWINGS

The present invention may be more easily understood with reference to the appended drawings which are included for example only and do not imply limitation to the invention.

DESCRIPTION OF THE PREFERRED EMBODIMENT

A method of manufacturing semiconductor devices according to the present invention will be explained in detail with reference to an embodiment shown by the attached drawings.

Figure 2A:
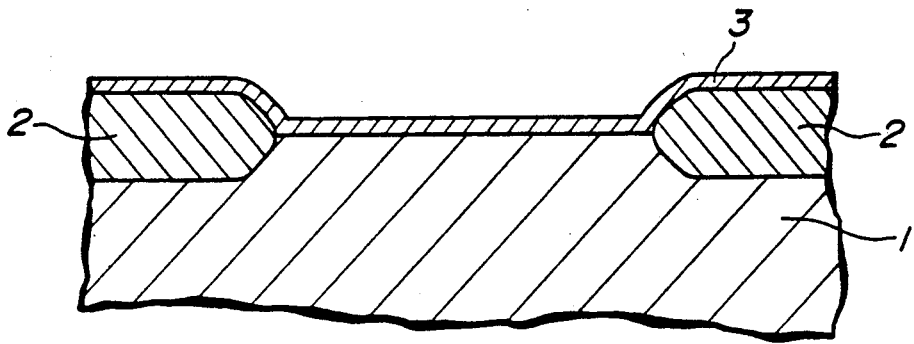
FIG. 2a-2c are progressive cross sectional views showing construction of an embodiment of a semiconductor device according to the method of the invention.
Figure 4:
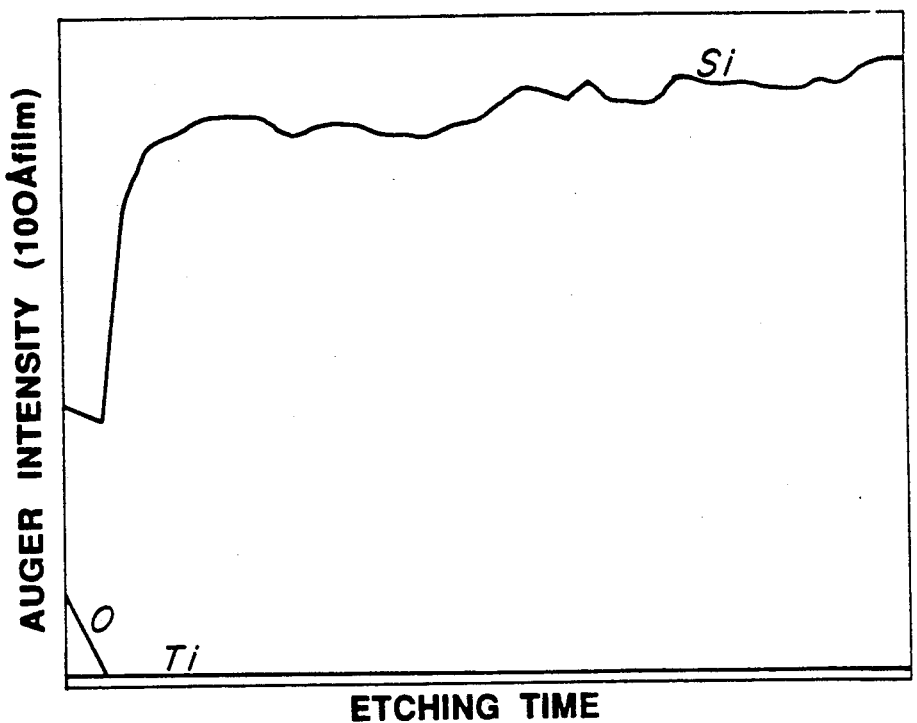
FIG. 4 is a graph showing distribution of elements in a case where a 100Å film is used.
Figure 5:
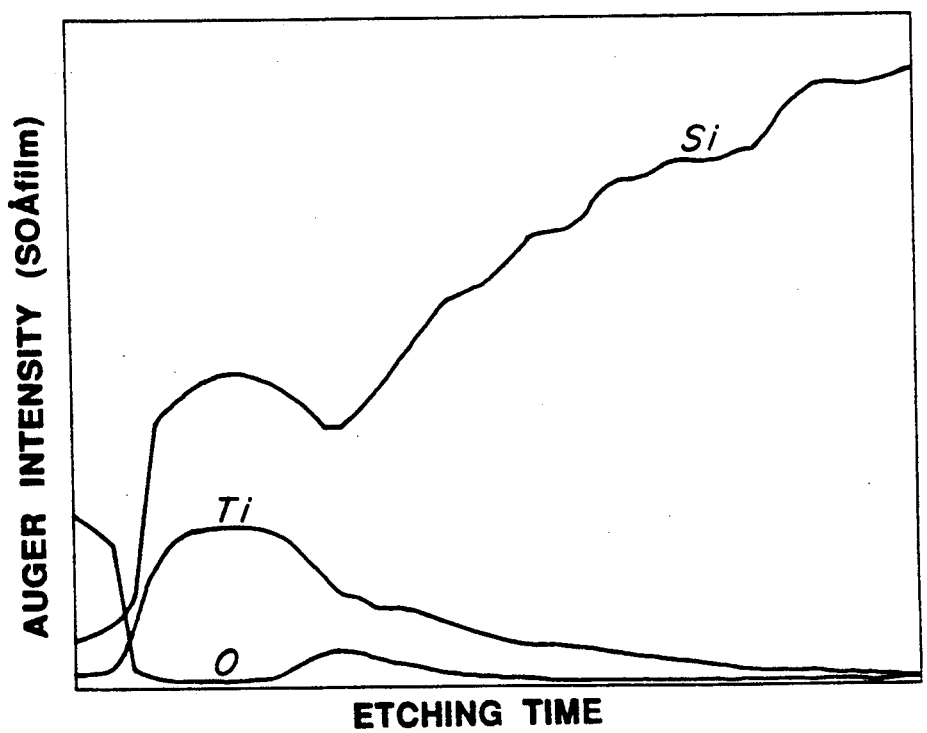
FIG. 5 is a graph showing distribution of elements in a case where a 50Å film is used.

FIG. 2a shows a silicon substrate 1 on which a $SiO_2$ field insulating film 2 has been selectively formed. Another $SiO_2$ film 3, having a thickness of less than 50Å is then formed over the exposed surface of the silicon substrate 1 and the field insulating film 2. This layer promotes reaction with a overlaying titanium layer, however, as seen in FIG. 4, if the $SiO_2$ film 3 is formed thicker than 50Å for example 100Å, diffusion will not occur sufficiently during a subsequent annealing and etching process and the oxygen and titanium distribution throughout a formed $TiSi_2$ will be insufficient. On the other hand, referring to FIG. 5, using a film with a thickness of 50Å or less promotes diffusion and improves oxygen distribution and the titanium content of the $TiSi_2$ barrier layer thus formed, improving barrier resistance to spikes from, aluminium, for example. Thus, according to the method of the invention, the $SiO_2$ film 3 is formed to be less than 50Å at which thickness sufficient diffusion will occur.

Figure 2B:
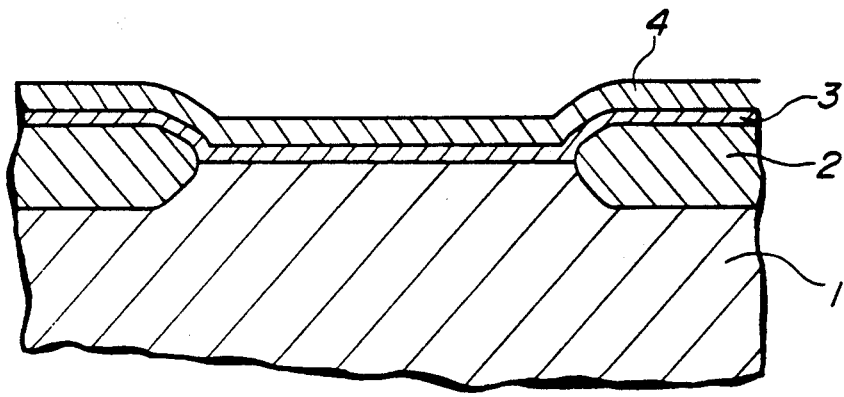

As before mentioned and shown in FIG. 2b, a titanium (Ti) film 4, having a thickness of 400Å is formed over the entire surface of the previously laid $SiO_2$ film 3 using a sputtering process, for example.

Figure 2C:
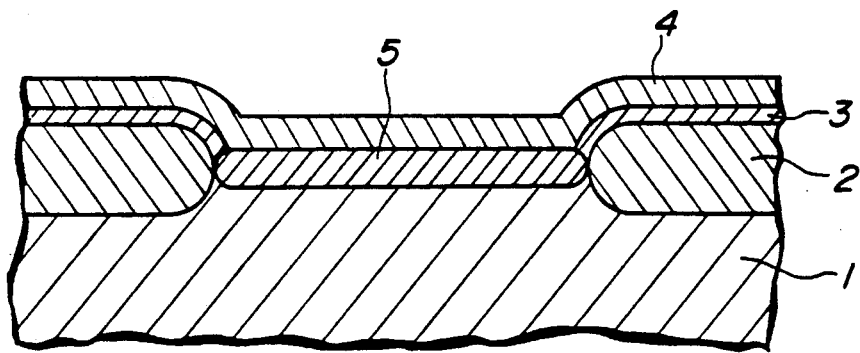

Then, low temperature lamp annealing (rapid annealing) is performed to a temperature of 600° C. In a low temperature annealing process, a silicon compound reacts with a metal, the low temperature annealing process of the invention is for forming a titanium silicide film 5 as shown in FIG. 2c. The titanium silicide film 5 comprises and $Ti_5Si_3$ and TiSi, and the titanium film 4 is oxidized into $TiO_2$ against the titanium silicide film 5. The remaining unreacted titanium film 4 and the $TiO_2$ is then removed through a wet etching process using ammonia water or the like.

Next, the titanium silicide film 5 is converted into a $TiSi_2$ film 6 by performing a second annealing at 900° C. as a high temperature annealing process. If the high temperature annealing is carried out at a lower temperature, 800° C. for example, the formed $TiSi_2$ indicates a high resistance value, substantially 3Ω/□ because of oxygen remaining in the $TiSi_2$ film 6. Thus, according to the method of the invention, the second annealing is carried out at substantially 900° C., which can degas the remaining oxygen in the $TiSi_2$ film 6, thus giving the film a lower resistance value of 4Ω/□.

Figure 1:
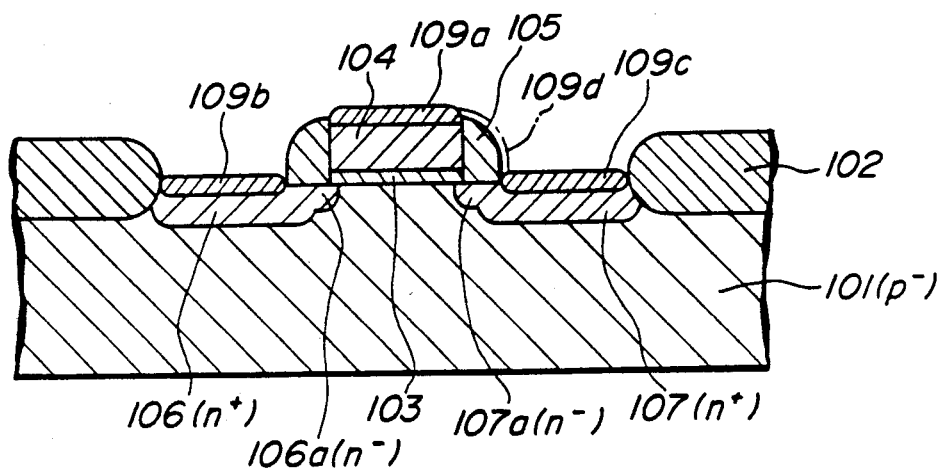
FIG. 1 is a cross sectional view of a semiconductor device of the prior art.
Figure 3:
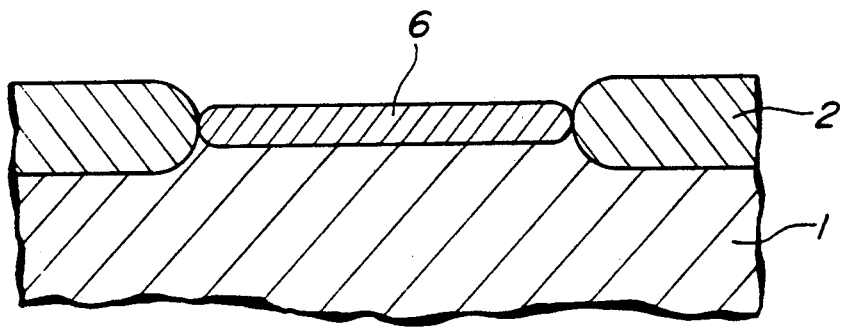
FIG. 3 is a semiconductor device according to an embodiment of the present invention.

Thus the device of the embodiment, as shown in FIG. 3 may be formed with a structure significantly simpler than conventional devices, thus manufacturing reliability is improved.

Additionally, according to the invention efficient degassing of oxygen is carried out in the silicide layer providing a semiconductor device with a low resistance value. The silicide layer with low resistance value can effectively improve the characteristies of a transistor device.

As described clearly above, the semiconductor manufacturing method according to the present invention can effectively form a silicide layer with high selectivity, with no rising, allowing formation of transistors with decreased leak current characteristics.

Further, while the above construction embodies a transistor, the method of the invention may be readily applied to the manufacture of other semiconductor devices including various MOS LSIs, bipolar LSIs and bipolar CMOS LSIs.

While the present invention has been disclosed in terms of the preferred embodiment in order to facilitate better understanding thereof, it should be appreciated that the invention can be embodied in various ways without departing from the principles thereof. For example, although the low temperature annealing of the embodiment is carried out at 600° C., it is possible to select the low temperature annealing temperature in a range from 600° C. to 700° C. Likewise, the high temperature annealing may be alternatively be performed at temperature in a range from 800° to 1000°, depending on the characteristics desired. Therefore, the invention should be understood to include all possible embodiments and modifications to shown embodiments which can be embodied without departing from the principle of the invention as set out in the appended claims.

What is claimed is:

1. A method of manufacturing a semiconductor device comprising the steps of: forming a film of a silicon dioxide on a silicon substrate, the silicon dioxide film having a thickness of 20 to 50Å; forming a titanium metal film on said silicon dioxide film; annealing the substrate, the silicon dioxide film and the titanium metal film at a temperature to form a silicide layer on said silicon substrate; wherein, said annealing is comprised of a first substantially low temperature annealing and a second annealing, said first and second annealings forming a silicide layer on said silicon substrate, wherein, said first annealing is carried out at a temperature of 650° C. in argon gas by rapid thermal annealing wherein, said second annealing is carried out at a temperature of 900° C. by rapid thermal annealing and wherein, said silicide layer has a resistance value of substantially 4Ω/□.

2. A method of manufacturing a semiconductor device as set forth in claim 1 wherein, after said first annealing, said semiconductor device is subjected to wet etching.

3. A method of manufacturing a semiconductor device as set forth in claim 1 wherein, said titanium film is formed with a thickness of 400Å.

4. A method of manufacturing a semiconductor device comprising the steps of: selectively forming a film of a silicon compound on areas of a silicon substrate;

forming a second film of said silicon compound over said selectively formed film and said silicon substrate said second film having a thickness of less than 50Å; forming a metal film on said second film, performing a first annealing at a temperature of 650° C. with rapid thermal annealing on said substrate; said silicon film and said metal film; performing a second annealing on said substrate; said silicon film and said metal film, said second annealing being performed at a higher temperature than said first annealing for forming a silicide layer on said substrate; wherein, after said second annealing, said semiconductor device is subject to etching; wherein, said silicon compound is $SiO_2$; wherein, said metal film is a titanium film; wherein, said titanium film is formed with a thickness of 400Å; wherein, said second annealing is carried out with rapid thermal annealing at a temperature of 900° C.; and wherein, said silicide layer has a resistance value of substantially 4Ω/□.

* * * * *